United States Patent [19]

Oh

[11] Patent Number: 5,073,731

[45] Date of Patent: Dec. 17, 1991

[54] BOOTSTRAPPING LEVEL CONTROL CIRCUIT FOR WORD LINE SIGNAL PRODUCING CIRCUIT IN A DRAM

[75] Inventor: Jong H. Oh, Kyungki-Do, Rep. of Korea

[73] Assignee: Hyundai Electronics Industries Co., Ltd., Kyungki, Rep. of Korea

[21] Appl. No.: 586,000

[22] Filed: Sep. 21, 1990

[30] Foreign Application Priority Data

Sep. 23, 1989 [KR] Rep. of Korea .................... 89.13708

[51] Int. Cl.[5] .................... H03K 19/12; H03K 19/096
[52] U.S. Cl. .................................... 307/482; 307/443; 307/465; 307/553; 365/230.06; 365/189.09; 365/189.11
[58] Field of Search ............... 307/443, 445, 482, 465, 307/553; 365/225.7, 230.06, 189.09, 189.11

[56] References Cited

U.S. PATENT DOCUMENTS 4,896,297 1/1990 Miyatake et al. ............. 365/189.11
4,922,138 5/1990 Hashimoto et al. ................ 307/482

OTHER PUBLICATIONS

IBM Tech. Disc. Bul., "Dynamic Logic Driver", Long et al., vol. 17, No. 7, 12/74.

Primary Examiner—Stanley D. Miller
Assistant Examiner—Margaret R. Wambach
Attorney, Agent, or Firm—Merchant, Gould, Smith, Edell, Welter & Schmidt

[57] ABSTRACT

A bootstrapping level control circuit for use in a word line signal producing circuit in a DRAM is disclosed. The bootstrapping level control circuit detects an existing potential level at a word line signal source and provides variable bootstrapping efficiency according to the detected existing potential level at the word line signal source to supply sufficient supply voltage Vcc of the word line signal source to a memory cell array apparatus and to thereby prevent double bootstrapping effects from occurring in a word line signal transferring control circuit. The bootstrapping level control circuit further comprises a Vcc level detector for detecting the existing potential level at the word line signal source. The Vcc level detector includes a first, second and a third Vcc level detecting circuits with each Vcc level detecting circuit having a predetermined inverting level, respectively, being different relative to each other. A logic combination circuit is provided for logically combining a bootstrapping control signal with each detected signal detected by each first, second and third Vcc level detecting circuit. An inverting circuit is also provided for delaying each logically combined signal from the logic combination circuit to invert each logically combined signal. A bootstrapping circuit is provided for bootstrapping a bootstrapping point by receiving each inverted signal, such that, in use, the bootstrapping point is bootstrapped depending upon the inverted signals from the inverting circuit, thereby varying bootstrapping efficiency of the bootstrapping level control circuit depending upon the potential level detected at the word line signal source.

12 Claims, 3 Drawing Sheets

BOOTSTRAPPING LEVEL CONTROL CIRCUIT FOR WORD LINE SIGNAL PRODUCING CIRCUIT IN A DRAM

BACKGROUND OF THE INVENTION

1. Field of the Invention

The invention relates to a bootstrapping level control circuit for word line signal producing circuit, and more particularly, to a bootstrapping level control circuit for word line signal producing circuit in a DRAM for changing the efficiency of a bootstrapping according to the potential at the word line signal source.

2. Information Disclosure Statement

In general, in either a P-MOSFET or N-MOSFET, there is a loss of a threshold voltage. Thus, when the N-MOSFET is used as a switch, a supply voltage Vcc (logic "high" state), which is supplied via the N-MOSFET, is transferred as much as the voltage difference of Vcc-Vth (Vth represents the threshold voltage of the N-MOSFET). On the other hand, when a P-MOSFET is used as a switch, the level of the ground potential (logic "low" state) is transferred as an absolute value, Vth. Thus, for solving the above problems, a bootstrapping circuit is used. Here, when the N-MOSFET is used, the gate voltage of the N-MOSFET is increased by the threshold voltage Vth thereof as compared to the drain voltage thereof, and when the P-MOSFET is used, at the least, the gate voltage of the P-MOSFET is decreased by the absolute value of the threshold voltage (Vth) as compared to the drain voltage thereof.

Accordingly, the desired capacitor is used for bootstrapping between the gate electrode and the source electrode of the P-MOSFET or the N-MOSFET, respectively. Alternatively, a voltage-variable capacitor can be used in the P-MOSFET or the N-MOSFET. The latter is referred as a self-bootstrapping method. Each of the above two methods are well-known as a prior art.

The circuit and operation of the prior art bootstrapping circuit will be described as follows.

Referring to FIG. 1, when a MOSFET Q is used as the switching circuit(10), the efficiency, Beff, of the bootstrapping is determined by the following equation:

$$B_{eff} = \frac{C_{gs} + C_{gd}}{C_{gs} + C_{para} + C_{gd}}$$

Here, Cgs is the capacitance between the gate electrode and the source electrode of the MOSFET Q, Cpara is the parasitic capacitance of the gate electrode thereof, Cgd is the capacitance between the gate electrode and the drain electrode thereof. The symbol "B" represents the terminal of the substrate for supplying a substrate voltage, Vbb, not shown.

The bootstrapping is used, particularly, in the word line signal producing circuit in the Dynamic Random Access Memory (DRAM) to completely and sufficiently supply the supply voltage Vcc to a memory cell. Herein, the bootstrapping utilized in the N-MOSFET will be described.

FIG. 2 illustrates the prior art word line signal producing circuit 20 using a bootstrapping in a DRAM. Referring to the drawing, the node N1 is a bootstrapping point to which a word line switching signal SWφ1 is supplied through a word line W1. The word line switching signal SWφ1 may be a word line signal source φ1 which can be either supplied or not, by means of a switch, not shown in the drawing. A parasitic capacitance, Cpara, is connected, in parallel, to the word line w1. A word line signal transferring control circuit 3 comprises MOSFET Q1 and MOSFET Q2 for controlling the transfer of the word line switching signal SWφ1 from the word line W1 to a word line W2. As for the MOSFET Q1 the gate electrode is connected to the node N2, the source electrode is connected to the word line W1, and the drain electrode is connected to the word line W2. As for the MOSFET Q2, the supply voltage Vcc is supplied to gate electrode, a word line transferring control signal φ3 is supplied to the drain electrode, and the source electrode is connected to a Node N2. A node N3 in a memory cell array apparatus 2, which comprises a plurality of a memory cell 2A, is connected to the word line W2 selected by the word line signal transferring control circuit 3. The bootstrapping level control circuit 1 comprises a MOSFET capacitor, Cboost, which functions as a capacitor for bootstrapping the bootstrapping point, N1 node, at the word line W1. The MOSFET capacitor, Cboost, comprises a gate electrode connected to the node N1 with a drain electrode and a source electrode being connected to each other. A control signal φ2 supplied to the drain electrode connected to the source electrode of the MOSFET capacitor, Cboost, is a bootstrapping control signal in order to bootstrap the node N1.

The operation of the circuit shown in FIG. 2 is described below in conjunction with the wave forms of FIG. 3.

In the wave forms of the FIG. 3, just before the time T1, if the word line transferring control signal φ3 is shifted from 0 V to the supply voltage Vcc, and at the time T1, if the word line signal source φ1 and the word line switching signal SWφ1 are shifted from 0 V to the supply voltage Vcc, the supply voltage Vcc is transferred from the word line W1, through the MOSFET Q1, to the word line W2. After the time T1, the potential level at the node N2 is increased from the voltage difference of Vcc−Vth (Q2) to an increasing voltage of Vcc+ΔV1 as a result of to the self-bootstrapping effect in the MOSFET Q1. Here, Vth (Q2) is defined as the threshold voltage of the MOSFET Q2. If the voltage V1 is defined as the voltage occurred by the self-bootstrapping effect in MOSFET Q1, then ΔV1=V1−Vth (Q2). Thus, in order to transfer the complete supply voltage, Vcc, of the word line switching signal SWφ1 which is a word line signal source φ1, via MOSFET Q1, to the word line W2, at the time T2, a bootstrapping control signal φ2 is shifted from 0 V to the supply voltage, Vcc, and the word line switching signal SWφ1 is shifted from the supply voltage, Vcc, to 0 V, so that the potential level at the node N1 becomes Vcc+ΔV. Wherein the ΔV is the increased voltage created by the bootstrapping efficiency $$(B_{eff}) \left( \frac{CP_{boost}}{CP_{boost} + CP_{para}} \right)$$

which is determined by both the bootstrapping capacitor Cboost and the parasite capacitor Cpara. Wherein the CPboost is a capacitance of the bootstrapping capacitor Cboost, and CPpara is a capacitance of the parasitic capacitor Cpara. Consequently, since the node N2 formed at the gate electrode of the MOSFET Q1 in the word line signal transferring control circuit 3 is doubly effected by the bootstrapping, as mentioned above, the potential level of the node N2 becomes finally a potential level of $Vcc+\Delta V1+\Delta V2$, wherein $\Delta V2$ is defined as the potential level of the node N1, i.e. the potential level bootstrapped by the voltage $Vcc+\Delta V$. Thus, a higher voltage is applied to a PN junction constituting the MOSFET Q1 itself and a gate insulating layer, respectively, which are not shown in drawing.

For example, assuming that, when $Vcc=7$ V, the bootstrapping efficiency of the node N1 is 40% and the self-bootstrapping efficiency of the MOSFET Q1 is 40%. At time t2, a voltage which is above 15 V is applied to the gate electrode of the MOSFET Q1. At the time, if the substrate voltage Vbb is $-2.5$ V, the voltage applied to both the PN junction of the MOSFET Q1 and the gate insulating layer becomes a relatively higher voltage of 17.5 V. Thus, there is a problem in that the break down of the insulation layer formed at both the gate electrode and the PN junction of the MOSFET Q1 occurs by the application of the undesired higher voltage.

Accordingly, it is an object of the present invention to solve the problems set forth above and to provide the bootstrapping level control signal for word line signal producing circuit by detecting the potential level at the word line signal source, and varying the efficiency of the bootstrapping according to the detected potential level, thereby removing the double bootstrapping effect occurred in the word line signal transferring control circuit.

The preceding objects should be construed as merely presenting a few of the more pertinent features and applications of the invention. Many other beneficial results can be obtained by applying the disclosed invention in a different manner or modifying the invention within the scope of the disclosure. Accordingly, other objects and a fuller understanding of the invention may be had by referring to both the summary of the invention and the detailed description, below, which describe the preferred embodiment in addition to the scope of the invention defined by the claims considered in conjunction with the accompanying drawings.

SUMMARY OF THE INVENTION

The improved bootstrapping level control circuit of the present invention is defined by the claims with a specific embodiment shown in the attached drawings. For the purpose of summarizing the invention, the invention relates to a bootstrapping level control circuit for use in a word line signal producing circuit in a DRAM for detecting an existing potential level at the word line signal source. The bootstrapping level control circuit provides for variable bootstrapping efficiency according to the detected existing potential level at the word line signal source thereby supplying sufficient voltage Vcc to a memory cell array apparatus and preventing double bootstrapping effects from occurring in a word line signal transferring control circuit. The bootstrapping level control circuit comprises a Vcc level detector for detecting the existing potential level at the word line signal source. The Vcc level detector includes a first, a second and a third Vcc level detecting circuit with each Vcc level detecting circuit having a predetermined inverting level, respectively, with each predetermining inverting level of each Vcc level detecting circuit being different relative to each other. The first, second and third Vcc level detecting circuits of the Vcc level detector are connected, in parallel, to the word line signal source, respectively, such that, in use, each Vcc level detecting circuit outputs a detected signal. A logic combination circuit for logically combining a bootstrapping control signal with each detected signal detected by each of the first, second and third Vcc level detecting circuits of the Vcc level detector 4 is utilized. The logic combination circuit includes a NAND gate G5 having its two inputs connected to each other for receiving in use the bootstrapping control signal The logic combination circuit further includes NAND gates G6, G7 and G8, with one input of each of the NAND gates being connected together and to the inputs of the NAND gate G5 to enable NAND gates G6, G7 and G8 to receive in use the bootstrapping control signal. Each remaining input of the NAND gates G6, G7 and G8 is respectively connected to each first, second and third Vcc level detecting circuit to enable the reception of the detected signals of the Vcc level detecting circuits, respectively. In use each NAND gate outputs a logically combined signal. An inverting circuit is used with NOT gates G1, G2, G3 and G4 for receiving and delaying each logically combined signal outputted from each NAND gate G5, G6, G7 and G8 of the logic combination circuit, respectively. The NOT gates of the inverting circuit invert each logically combined signal to form an inverted signal for each logically combined signal received. A bootstrapping circuit receives each inverted signals for bootstrapping a bootstrapping point. The bootstrapping circuit includes a bootstrapping capacitor Cboost and MOSFET capacitors C2, C3 and C4, with each capacitor having a source, a drain and a gate electrode. The source electrode and the drain electrode of each capacitor are connected to each other and further connected to the NOT gate G1, G2, G3 and G4 of the inverting circuit, respectively. The gate electrode of each bootstrapping capacitor or Cboost, C2, C3 and C4, is connected, in parallel, to the bootstrapping point, respectively, such that in use bootstrapping point is bootstrapped depending upon the inverted signals outputted from the respective NOT gates G1, G2, G3 and G4 of the inverting circuit thereby varying bootstrapping efficiency of the bootstrapping level control circuit depending upon the potential level detected at the word line signal source.

Preferably, each of the first, second and third Vcc level detecting circuits of the bootstrapping level control circuit include a plurality of MOSFETs Q3, Q4, Q5, Q6 and Q7 which are sequentially connected in cascade, and a NOT gate G9. The MOSFET Q3 comprises a gate electrode and a drain electrode connected to each other and to the word line signal source, and a source electrode. The MOSFET Q4 comprises a gate electrode and a drain electrode connected to each other and to the source electrode of the MOSFET Q3, and a source electrode connected to a junction P1. The MOSFET Q5 comprises a gate electrode and a drain electrode connected to each other and to the junction P1, and a source electrode. The MOSFET Q6 comprises a gate electrode and a drain electrode connected to each other and to the source electrode of the MOSFET Q5, and a source electrode connected to a junction P2. Each of gate electrodes of each MOSFET Q3, Q4, Q5 and Q6 include a predetermined a width Wna, respectively. The MOSFET Q7 comprises a gate electrode connected to the junction P1, a drain electrode connected to the junction P2, and a source electrode connected to a ground. The gate electrode of the MOSFET Q7 includes a predetermined width Wnb such that, in use, the MOSFET Q7 varies a potential level at the junction P2 by varying the value of the on-resistance in accordance with a potential level of the junction P1 according to the ratio of Wna to Wnb. The NOT gate G9 includes an input terminal connected to the junction P2, and an output terminal connected to any one of the remaining inputs of the NAND gates G6, G7 and G8, in which the NOT gate G9 includes a predetermined inverting level, thereby alternatively inverting the potential level of the junction P2 through the NOT gate G9, either to a "high" level state or to a "low" level state, depending upon the predetermined inverting level of the NOT gate G9.

Preferably, each MOSFET Q3, Q4, Q5, Q6 and Q7 of the bootstrapping level control circuit is an N-channel MOSFET.

The more pertinent and important features of the present invention have been outlined above in order that the detailed description of the invention which follows will be better understood and that the present contribution to the art can be fully appreciated. Additional features of the invention described hereinafter form the subject of the claims of the invention. Those skilled in the art can appreciate that the conception and the specific embodiment disclosed herein may be readily utilized as a basis for modifying or designing other structures for carrying out the same purposes of the present invention. Further, those skilled in the art can realize that such equivalent constructions do not depart from the spirit and scope of the invention as set forth in the claims.

BRIEF DESCRIPTION OF THE DRAWINGS

For fuller understanding of the nature and objects of the invention, reference should be had to the following detailed description taken in conjunction with the accompanying drawings in which.

Similar reference characters refer to similar parts throughout the several views of the drawings.

DETAILED DESCRIPTION OF THE INVENTION

Figure 1:
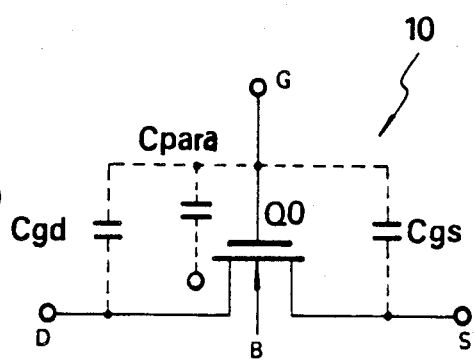
FIG. 1 illustrates a principle N-channel MOSFET used as a switching circuit.
Figure 2:
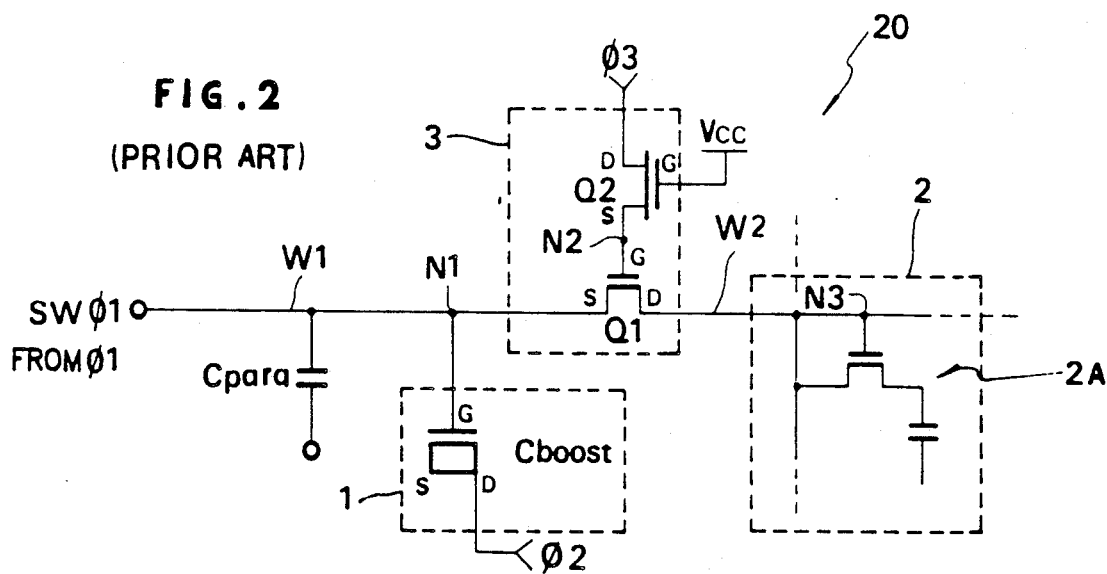
FIG. 2 illustrates a word line signal producing circuit in a dynamic ram using a prior art bootstrapping capacitor.
Figure 3:
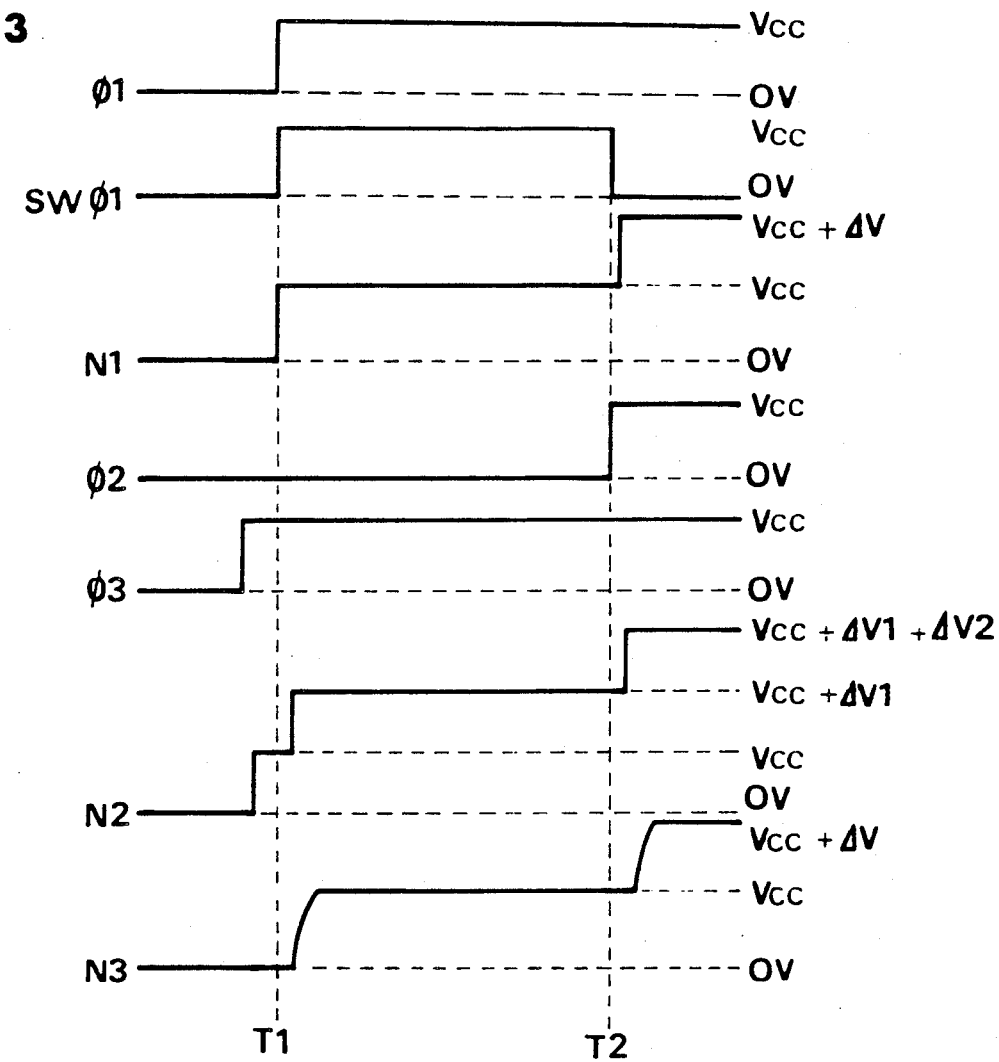
FIG. 3 illustrates wave forms for illustrating the operation of the word line signal producing circuit as shown in FIG. 2.

FIG. 1, FIG. 2 and FIG. 3 have been described above accordingly further description is not described considered necessary.

Figure 4:
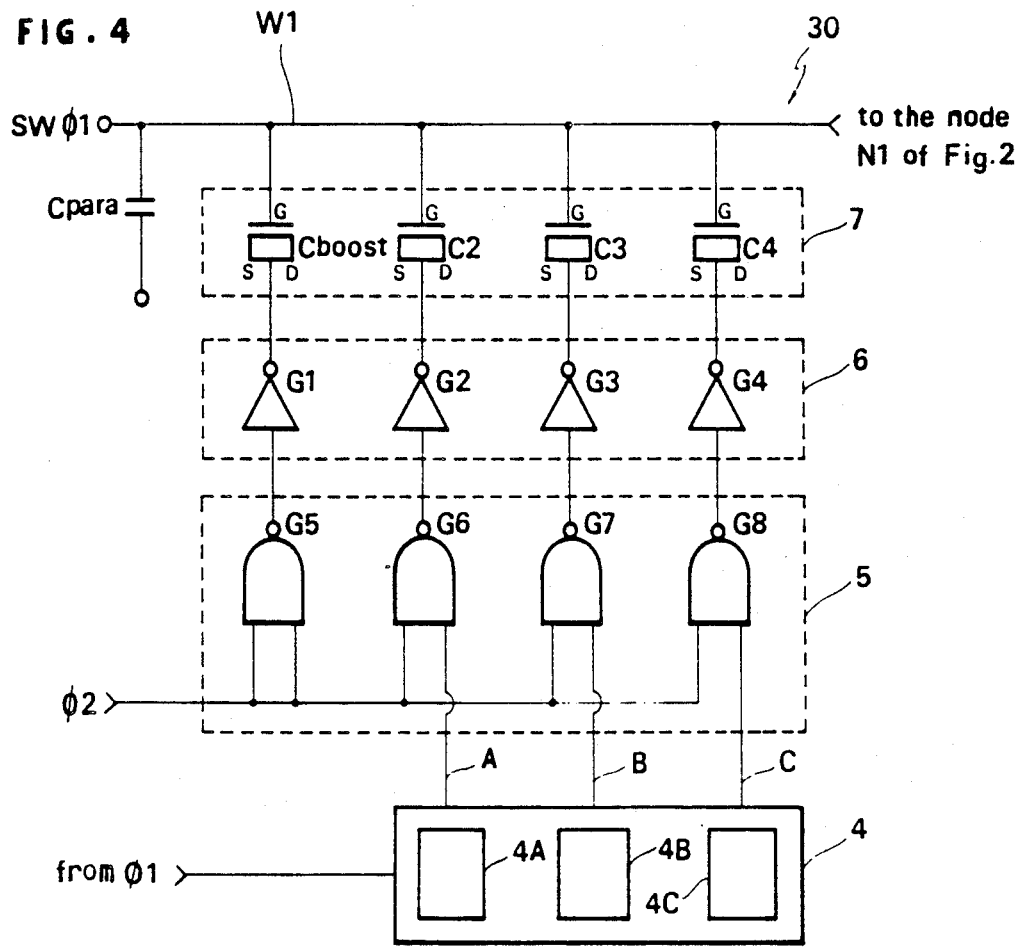
FIG. 4 illustrates a bootstrapping level control circuit of the present invention.

FIG. 4 illustrates a bootstrapping level control circuit 30 for word line signal producing circuit in a DRAM according to the present invention. The structure of the present invention is described with the aid of FIG. 2 and FIG. 3. In order to detect the voltage potential level at the word line signal source $\phi 1$, a Vcc level detector 4 which comprises a first, a second and a third Vcc level detecting circuit 4A, 4B and 4C is provided.

The first, second and third Vcc level detecting circuits 4A, 4B and 4C of the Vcc level detector 4 are connected, in parallel, to the word line signal source $\phi 1$, respectively. Each first, second and third Vcc level detecting circuit 4A, 4B and 4C has a predetermined inverting level, respectively, with the predetermined inverting level each Vcc level detecting circuit being different relative to each other. Therefore, the first, second and third Vcc level detecting circuits 4A, 4B and 4C, respectively, detect the potential level at the word line signal source $\phi 1$, and output the respective signals detected therefrom, via the output lines A B and C formed therein, depending upon the potential level at the word line signal source $\phi 1$. The structure of the respective first, second and third Vcc level detecting circuits 4A, 4B and 4C of the Vcc level detector 4 and the detailed operation thereof will be described in conjunction with FIG. 5.

Referring again to FIG. 4, the respective output lines A, B and C of the respective first, second and third Vcc level detecting circuits 4A, 4B and 4C of the Vcc level detector 4 are connected to a logic combination circuit 5. The logic combination circuit 5 logically combine the respective signals detected from each of the first, second and third Vcc level detecting circuits 4A, 4B and 4C of the Vcc level detector 4 with the bootstrapping control signal $\phi 2$, thereby outputting the logically combined signals for each detected signal received from each Vcc level detecting circuit 4A, 4B and 4C combined with the bootstrapping control signal $\phi 2$, respectively. The logic combination circuit 5 includes a NAND gate G5, G6, G7 and G8. The two inputs of the NAND gate G5 are connected to each other and connected to receive a bootstrapping control signal $\phi 2$. As for NAND gates G6, G7 and G8, one input of each is connected to each other and connected to receive the bootstrapping control signal $\phi 2$. Each remaining input of NAND gates G6, G7 and G8 is connected, respectively, to each output lines A, B and C of the first, second and third Vcc level detecting circuits 4A, 4B and 4C to receive the detected signals therefrom.

The logically combined signals outputted from the logic combination circuit 5, that is, the signals outputted from the respective NAND gates G5, G6, G7 and G8 thereof are correspondingly applied to NOT gates G1, G2, G3 and G5 which constitute an inverting circuit 6 for delaying, respectively, the signals outputted from the logic combination circuit 5 to thereby invert the signals, respectively. The respective inverted signals are then applied to a bootstrapping circuit 7 for bootstrapping the node N1 of the word line signal producing point.

The bootstrapping circuit 7 comprises a bootstrapping capacitor Cboost, MOSFET capacitors C2, C3 and C4, with each MOSFET capacitor's source electrode and drain electrode being connected to each other and connected to the NOT gate G1, G2, G3 and G4 of the inverting circuit 6, respectively, and the gate electrode of each capacitor Cboost, C2, C3 and C4 connected, in parallel, to the node N1 of the bootstrapping point, respectively. Also, at the node N1, a parasitic capacitor Cpara is connected, in parallel, to the word line W1.

Therefore, according to the structure mentioned above, since all the inputs of the NAND gate G5 of the logic combination circuit 5 are supplied with the bootstrapping control signal $\phi 2$, the bootstrapping capacitor Cboost of the bootstrapping circuit 7 always operates as a bootstrapping capacitor which dependent upon the "high" level state of the bootstrapping control signal φ2. Each remaining MOSFETs C2, C3 and C4 selectively operates as a bootstrapping capacitor, depending upon a selective enablement of the respective first, second or third Vcc level detecting circuits 4A, 4B or 4C of the Vcc level detector 4.

Figure 5:
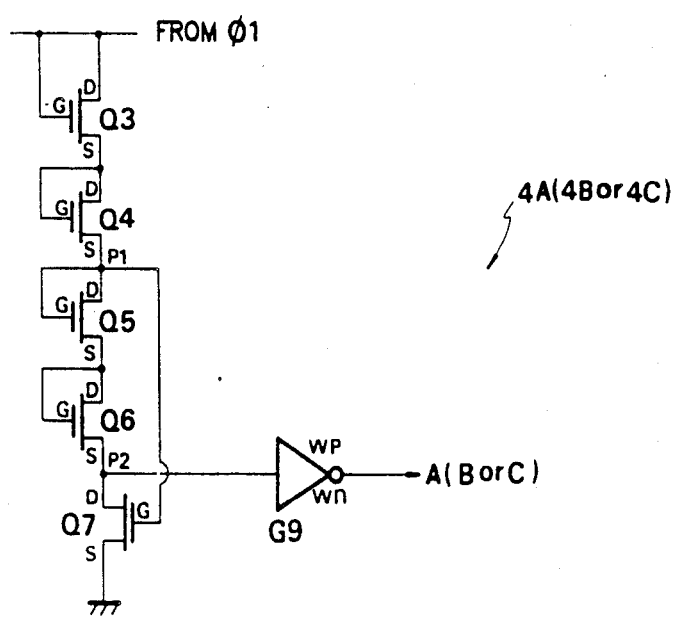
FIG. 5 illustrates an example of the Vcc level detecting circuit of the Vcc level detector of FIG. 4.

FIG. 5 illustrates the first Vcc level detecting circuit 4A of the Vcc level detector 4. It is noted that since the first, second and third Vcc level detecting circuits 4A, 4B and 4C are of the same structure, only the detailed description of the first Vcc level detecting circuit 4A is presented herein in order to avoid unnecessary complexity of the drawing. However, although the structure of each is the same, the respective first, second and third Vcc level detecting circuits 4A, 4B and 4C have the different inverting levels relative to each other such that each MOSFET of plurality of MOSFETs which constitute each of the first, second and third Vcc level detecting circuits 4A, 4B and 4C, is designed to have the different width of the gate electrode thereof, thereby enabling each Vcc level detecting circuit to respectively detect the potential level at the word line signal source φ1.

Referring to the structure of the first Vcc level detecting circuit 4A as shown in FIG. 5, at the word line signal source φ1 which is to be detected, a plurality of MOSFETs Q3, Q4, Q5, Q6 and Q7 are sequentially connected in cascade, in which a gate electrode and a source electrode of each MOSFETs Q3, Q4, Q5 and Q6 are connected to each other. Also, the gate electrode of the MOSFET Q7 is connected junction P1, positioned between the MOSFETs Q4 and Q5, and the source electrode of the MOSFET Q7 is connected to a ground. At the junction P2, positioned between the MOSFETs Q6 and Q7, a NOT gate G9 is connected, with the NOT gate G9 having an output connected to the output line A as shown in FIG. 4. The NOT gate G9 comprises a N-channel MOSFET having the width Wn of the gate electrode and a P-channel MOSFET having the width Wp of the gate electrode, to thereby determine the inverting level itself according to the ratio of the widths of the each gate electrode thereof, that is, the ratio of the Wp to the Wn.

Thus, assuming that the width of each gate electrode of the respective MOSFETs Q3, Q4, Q5 and Q6 is a Wna, and the width of the gate electrode of the MOSFET Q7 is a Wnb, respectively, when the word line signal source φ1 having the potential level of the supply voltage Vcc is detected by the Vcc level detecting circuit 4A, the potential level of the supply voltage Vcc is divided according to the ratio of the Wna to Wnb, to thereby produce the voltage divided by the MOSFETs Q3, Q4, Q5, Q6 and Q7, and the divided voltage is then inverted at the NOT gate G9. In other words, upon the potential level at the junction P1 between the MOSFETs Q4 and Q5, the value of the on-resistance of the MOSFET Q7 is varied, so that the potential level at the junction P2 between the MOSFETs Q6 and Q7 is varied. Therefore, the potential level at the junction P2 between the MOSFETs Q6 and Q7 is alternatively inverted at the NOT gate G9, depending upon the inverting level of the NOT gate G9, to thereby output through the output line A either a logic "high" level state or a logic "low" level state of the potential level inverted therefrom.

According to the Vcc level detector 4, the potential level at the word line signal source φ1 can be detected by each of the first, second and third Vcc level detector circuits 4A, 4B and 4C having a predetermined inverting level, respectively, which is different from each other.

Thus, the operation of the bootstrapping level control circuit will be described with dividing into respective voltage portions. For example, it is assumed that each of the first, second, third Vcc level detecting circuits 4A, 4B and 4C have inverting level of 6.0 V, 6.4 V and 6.9 V, respectively, and the bootstrapping control signal φ2 is in logic "high" state.

1) In case of Vcc<6.0 V

If the potential level at the word line signal source φ1 detected by each of the first, second and the third Vcc level detecting circuits 4A, 4B and 4C has a voltage less than 0.6 V, each of the output lines A, B and C of the first, second and the third Vcc level detecting circuits 4A, 4B and 4C of the Vcc level detector 4 becomes logic "high" state. Thus, the MOSFET capacitors C2, C3 and C4 are controlled by the bootstrapping control signal φ2 so that all of the MOSFET capacitors C2, C3 and C4 together with the bootstrapping capacitor Cboost operate as bootstrapping capacitors. Thus, the bootstrapping efficiency Beff1 in this case is determined as follows;

$$Beff1 = \frac{CPboost + CP2 + CP3 + CP4}{(CPboost + CP2 + CP3 + CP4) + CPpara}$$

Here, CPboost is a capacitance of the bootstrapping capacitor Cboost, CPpara is a parasitic capacitance of the parasitic capacitor Cpara, each of CP2, Cp3 and CP4 represent a capacitance of the MOSFET capacitors C2, C3 and C4, respectively.

2) In case of 6.0≦Vcc<6.5 V

If the potential level at the word line signal source φ1 detected by each of the first, second and third Vcc level detecting circuits 4A, 4B and 4C is a voltage between 6.0 V and 6.5 V, the output line A of the first Vcc level detecting circuit 4A of the Vcc level detector 4 becomes a logic "low" state and the output lines B and C of the second and third Vcc level detecting circuit 4B, 4C thereof become a logic "high" state. Thus, the MOSFET capacitor C2 is cut off and operates as a parasitic capacitor together with the parasitic capacitor Cpara. The remaining MOSFET capacitors C3 and C4 operate as bootstrapping capacitors together with the bootstrapping capacitor Cboost. Thus, the bootstrapping efficiency Beff2 of the bootstrapping in this case is determined as follows;

$$Beff2 = \frac{CPboost + CP3 + CP4}{(CPboost + CP3 + CP4) + (CP2 + CPpara)}$$

3) In case of 6.5≦Vcc<7.0 V

If the potential level at the word line signal source φ1 detected by each of the first, second and third Vcc level detecting circuits 4A, 4B and 4C is a voltage between 6.5 V and 7.0 V, the output lines A and B of the first and second Vcc level detecting circuits 4A and 4B become logic "low" state and the output line C becomes logic "high" state. Thus, the MOSFET capacitors C2 and C3 are cut off and operate as parasitic capacitors together with the parasitic capacitor Cpara. The MOSFET capacitor C4 is operated as a bootstrapping capacitor together with the bootstrapping capacitor Cboost. Thus, the bootstrapping efficiency Beff3 of the bootstrapping in this case is determined as follows;

$$Beff3 = \frac{CPboost + CP4}{(CPboost + CP4) + (CP2 + CP3 + CPpara)}$$

4) In case of Vcc>7.0 V

If the potential level at the word line signal source $\phi 1$ detected by each of the first, second and third Vcc level detecting circuit 4A, 4B and 4C has a voltage above 7.0 V, the output lines A, B and C of the first, second and the third Vcc level detecting circuits 4A, 4B, 4C of the Vcc level detector 4 become logic "low" state. Thus, the MOSFET capacitors C2, C3 and C4 are cut off and the bootstrapping capacitor Cboost is only operates as a bootstrapping capacitor. Thus, the bootstrapping efficiency Beff4 in this case is determined as follows;

$$Beff4 = \frac{CPboost}{CPboost + (CP2 + CP3 + CP4 + CPpara)}$$

It is noted that, in case 2), the MOSFET capacitor C2 is coupled with the parasitic capacitor Cpara in parallel, in case 3), the MOSFET capacitors C2 and C3 are coupled with the parasitic capacitor Cpara in parallel, in case 4), MOSFET capacitors C2 and C4 are coupled with the parasitic capacitor Cpara in parallel, respectively.

As described above, the bootstrapping efficiency determining the bootstrapping voltage is varied according to the voltage level at the word line signal source $\phi 1$. That is, as the Vcc voltage becomes higher, the efficiency of the bootstrapping becomes lower. For example, if it is assumed that CPboost=0.5, CP2=0.3, CP3=0.15 and CP4=0.05 and CPpara=0.25 CPboost, the efficiencies of the bootstrapping are determined, respectively, such that Beff1=0.8, Beff2=0.56, Beff3=0.44 and Beff4=0.4.

As described above, since the supply voltage Vcc becomes higher, the efficiency of the bootstrapping becomes lower, the efficiency control is accomplished by varying the capacitance of the bootstrapping capacitor. Thus, the maximum potential difference occurred at PN junction of the MOSFET or at the gate insulation layer can be controlled.

According to the present invention, the efficiency of the bootstrapping at the bootstrapping point can be controlled by detecting voltage thereat. Furthermore, the double bootstrapping effect can be prevented from occurring in the word line signal transferring circuit.

Furthermore, it should be noted that since all the signals illustrated in connection with FIGS. 2, 3, 4 and 5, that is, the word line signal source $\phi 1$, the word line switching signal SW$\phi 1$, the bootstrapping control signal $\phi 2$ and the word line transferring control signal $\phi 3$ are, respectively, provided with the prior art signal sources, with each having a difference time sequence relative to each other as shown in the drawing, the detailed description of the structure of the prior art control signal sources are not present herein in order to avoid unnecessary complexity.

Although this invention has been described in its preferred form with a certain degree of particularity, it is appreciated by those skilled in the art that the present disclosure of the preferred form has been made only by way of example and that numerous changes in the details of the construction, combination and arrangement of parts may be resorted to without departing from the spirit and scope of the invention.

What is claimed is:

1. A bootstrapping level control circuit for a word line signal producing circuit in a DRAM for completely supplying the potential of a word line signal source, through a word line signal transferring control circuit, to a memory cell array apparatus, when said word line signal transferring control circuit is enabled, said bootstrapping level control circuit comprises:

a Vcc level detector provided with a first, second and third Vcc level detecting circuits for respectively detecting the potential level at said word line signal source, to thereby output respective detected signals detected therefrom, with each said first, second and third Vcc level detecting circuit being connected, in parallel, to said word line signal source and having each predetermined inverting level being different relative to each other;

a logic combination circuit for logically combining a bootstrapping control signal $\phi 2$ with said respective detected signals detected by each said first, second and third Vcc level detecting circuit, said logic combination circuit including a NAND gate (G5) having two inputs connected to each other to receive said bootstrapping control signal $\phi 2$, and NAND gates (G6), (G7), and (G8) with one input of each said NAND gate (G6), (G7) and (G8) to receive said bootstrapping control signal $\phi 2$ and a remaining input of each said NAND gate (G6), (G7) and (G8) connected to each said first, second and third Vcc level detecting circuit, respectively, for receiving said respective detected signals of each said first, second and third Vcc level detecting circuit of said Vcc level detector, thereby outputting logically combined signals, respectively;

an inverting circuit for delaying each said logically combined signals outputted from each said NAND gate (G5), (G6), (G7) and (G8) of the logic combination circuit, said inverting circuit including a plurality of NOT gates (G1), (G2), (G3) and (G4), respectively, connected to each said NAND gate (G5), (G6), (G7) and (G8) for inverting each said logically combined signals from said logic combination circuit, to thereby output an inverted signal for each said logically combined signal, respectively; and, a bootstrapping circuit including a bootstrapping capacitor, MOSFET capacitors (C2), (C3) and (C4), respectively, connected, in parallel, to a bootstrapping point, node (N1), for bootstrapping said bootstrapping point, node (N1), depending upon each said inverted signal, respectively, received from each said NOT gates (G1), (G2), (G3) and (G4) of the inverting circuit, thereby varying the bootstrapping efficiency of said bootstrapping level control circuit depending upon the potential level at said word line signal source detected by each said first, second and third Vcc level detecting circuit to prevent double bootstrapping effects from being occurred in said word line transferring control circuit.

2. The bootstrapping level control circuit of claim 1, wherein each of said first, second and third Vcc level detecting circuits comprises:

a MOSFET (Q3) having a gate electrode and a drain electrode connected to each other and to said word line signal source, and a source electrode;

a MOSFET (Q4) having a gate electrode and a drain electrode connected to each other and to said source electrode of said MOSFET (Q3), and a source electrode connected to a junction (P1);

a MOSFET (Q5) having a gate electrode and a drain electrode connected to each other and to said junction (P1), and a source electrode;

a MOSFET (Q6) having a gate electrode and a drain electrode connected to each other and to said source electrode of said MOSFET (Q5), and a source electrode connected to a junction (P2), with each said gate electrode of each said MOSFET (Q3), (Q4), (Q5) and (Q6) having a predetermined a width Wna, respectively;

a MOSFET (Q7) having a gate electrode connected to said junction (P1), a drain electrode connected to said junction (P2), and a source electrode connected to a ground, with said gate electrode of said MOSFET (Q7) having a predetermined width Wnb such that, in use, said MOSFET (Q7) varies a potential level at said junction (P2) by varying the value of the on-resistance in accordance with a potential level of said junction (P1) according to the ratio of Wna to Wnb; and, a NOT gate (G9) having an input terminal connected to said junction (P2), and an output terminal connected to any one of said remaining inputs of said NAND gates (G6), (G7) and (G8), with said NOT gate (G9) having a predetermined inverting level, thereby alternatively inverting said potential level of said junction (P2) through said NOT gate (G9), either to a "high" level state or to a "low" level state, depending upon said predetermined inverting level of said NOT gate (G9).

3. The bootstrapping level control circuit of claim 2, wherein each said MOSFET (Q3), (Q4), (Q5), (Q6) and (Q7) is a N-channel MOSFET.

4. A bootstrapping level control circuit for a word line signal producing circuit in a DRAM for completely supplying the potential of a word line signal source, through a word line signal transferring control circuit, to a memory cell array apparatus, when said word line signal transferring control circuit is enabled, said bootstrapping level control circuit comprises:

a Vcc level detector provided with a first, second and third Vcc level detecting circuits for respectively detecting the potential level at said word line signal source, to thereby output respective detected signals detected therefrom, with each of said first, second and third Vcc level detecting circuit comprising:

a MOSFET (Q3) having a gate electrode and a drain electrode connected to each other and to said word line signal source, and a source electrode;

a MOSFET (Q4) having a gate electrode and a drain electrode connected to each other and to said source electrode of said MOSFET (Q3), and a source electrode connected to a junction (P1);

a MOSFET (Q5) having a gate electrode and a drain electrode connected to each other and to said junction (P1), and a source electrode;

a MOSFET (Q6) having a gate electrode and a drain electrode connected to each other and to said source electrode of said MOSFET (Q5), and a source electrode connected to a junction (P2), with each said gate electrode of each said MOSFET (Q3), (Q4), (Q5) and (Q6) having a predetermined a width Wna, respectively;

a MOSFET (Q7) having a gate electrode connected to said junction (P1), a drain electrode connected to said junction (P2), and a source electrode connected to a ground, with said gate electrode of said MOSFET (Q7) having a predetermined width Wnb such that, in use, said MOSFET (Q7) varies a potential level at said junction (P2) by varying the value of the on-resistance in accordance with a potential level of said junction (P1) according to the ratio of Wna to Wnb; and, a NOT gate (G9) having an input terminal connected to said junction (P2), and an output terminal connected to any one of said remaining inputs of said NAND gates (G6), (G7) and (G8), with said NOT gate (G9) having a predetermined inverting level, thereby alternatively inverting said potential level of said junction (P2) through said NOT gate (G9), either to a "high" level state or to a "low" level state, depending upon said predetermined inverting level of said NOT gate (G9);

a logic combination circuit for logically combining a bootstrapping control signal $\phi 2$ with said respective detected signals detected by each said first, second and third Vcc level detecting circuit, said logic combination circuit including a NAND gate (G5) having two inputs connected to each other to receive said bootstrapping control signal $\phi 2$, and NAND gates (G6), (G7) and (G8) with one input of each said NAND gate (G6), (G7) and (G8) to receive said bootstrapping control signal $\phi 2$ and a remaining input of each said NAND gate (G6), (G7) and (G8) connected to each said first, second and third Vcc level detecting circuit, respectively, for receiving said respective detected signals of each said first, second and third Vcc level detecting circuit of said Vcc level detector, thereby outputting logically combined signals, respectively;

an inverting circuit for delaying each said logically combined signals outputted from each said NAND gate (G5), (G6), (G7) and (G8) of the logic combination circuit, said inverting circuit including a plurality of NOT gates (G1), (G2), (G3) and (G4), respectively, connected to each said NAND gate (G5), (G6), (G7) and (G8) for inverting each said logically combined signals from said logic combination circuit, to thereby output an inverted signal for each said logically combined signal, respectively; and, a bootstrapping circuit including a bootstrapping capacitor, MOSFET capacitors (C2), (C3) and (C4), respectively, connected, in parallel, to a bootstrapping point, node (N1), for bootstrapping said bootstrapping point, node (N1), depending upon each said inverted signal, respectively, received from each said NOT gates (G1), (G2), (G3) and (G4) of the inverting circuit, thereby varying the bootstrapping efficiency of said bootstrapping level control circuit depending upon the potential level at said word line signal source detected by each said first, second and third Vcc level detecting circuit to prevent double bootstrapping effects from being occurred in said word line transferring control circuit.

5. The bootstrapping level control circuit of claim 4, wherein each said MOSFET (Q3), (Q4), (Q5), (Q6) and (Q7) is a N-channel MOSFET.

6. A bootstrapping level control circuit for a word line signal producing circuit in a DRAM for completely supplying the potential of a word line signal source, through a word line signal transferring control circuit, to a memory cell array apparatus, when said word line signal transferring control circuit is enabled, said bootstrapping level control circuit comprises:

a Vcc level detector provided with a first, second and third Vcc level detecting circuits for respectively detecting the potential level at said word line signal source, to thereby output respective detected signals detected therefrom, with each said first, second and third Vcc level detecting circuit being connected, in parallel, to said word line signal source and having each predetermined inverting level being different relative to each other;

a logic combination circuit for logically combining a bootstrapping control signal $\phi 2$ with said respective detected signals detected by each said first, second and third Vcc level detecting circuit, respectively;

an inverting circuit for delaying each said logically combined signals outputted from each said NAND gate (G5), (G6), (G7) and (G8) of the logic combination circuit, said inverting circuit including a plurality of NOT gates (G1), (G2), (G3) and (G4), respectively, connected to each said NAND gate (G5), (G6), (G7) and (G8) for inverting each said logically combined signals from said logic combination circuit, to thereby output an inverted signal for each said logically combined signal, respectively; and, a bootstrapping circuit including a bootstrapping capacitor, MOSFET capacitors (C2), (C3) and (C4), respectively, connected, in parallel, to a bootstrapping point, node (N1), for bootstrapping said bootstrapping point, node (N1), depending upon each said inverted signal, respectively, received from each said NOT gates (G1), (G2), (G3) and (G4) of the inverting circuit, thereby varying the bootstrapping efficiency of said bootstrapping level control circuit depending upon the potential level at said word line signal source detected by each said first, second and third Vcc level detecting circuit to prevent double bootstrapping effects from being occurred in said word line transferring control circuit.

7. The bootstrapping level control circuit of claim 6, wherein each of said first, second and third Vcc level detecting circuits comprises:

a MOSFET (Q3) having a gate electrode and a drain electrode connected to each other and to said word line signal source, and a source electrode;

a MOSFET (Q4) having a gate electrode and a drain electrode connected to each other and to said source electrode of said MOSFET (Q3), and a source electrode connected to a junction (P1);

a MOSFET (Q5) having a gate electrode and a drain electrode connected to each other and to said junction (P1), and a source electrode;

a MOSFET (Q6) having a gate electrode and a drain electrode connected to each other and to said source electrode of said MOSFET (Q5), and a source electrode connected to a junction (P2), with each said gate electrode of each said MOSFET (Q3), (Q4), (Q5) and (Q6) having a predetermined a width Wna, respectively;

a MOSFET (Q7) having a gate electrode connected to said junction (P1), a drain electrode connected to said junction (P2), and a source electrode connected to a ground, with said gate electrode of said MOSFET (Q7) having a predetermined width Wnb such that, in use, said MOSFET (Q7) varies a potential level at said junction (P2) by varying the value of the on-resistance in accordance with a potential level of said junction (P1) according to the ratio of Wna to Wnb; and, a NOT gate (G9) having an input terminal connected to said junction (P2), and an output terminal connected to any one of said remaining inputs of said NAND gates (G6), (G7) and (G8), with said NOT gate (G9) having a predetermined inverting level, thereby alternatively inverting said potential level of said junction (P2) through said NOT gate (G9), either to a "high" level state or to a "low" level state, depending upon said predetermined inverting level of said NOT gate (G9).

8. The bootstrapping level control circuit of claim 7, wherein each said MOSFET (Q3), (Q4), (Q5), (Q6) and (Q7) is a N-channel MOSFET.

9. A bootstrapping level control circuit of claim 6, wherein said logic combination circuit includes said NAND gate (G5) having two inputs connected to each other to receive said bootstrapping control signal $\phi 2$, and each said NAND gate (G6), (G7) and (G8) with one input of each said NAND gate (G6), (G7) and (G8) to receive said bootstrapping control signal $\phi 2$ and the remaining input of each said NAND gate (G6), (G7) and (G8) connected to each said first, second and third Vcc level detecting circuit, respectively, for receiving said respective detected signals of each said first, second and third Vcc level detecting circuit of said Vcc level detector, thereby outputting logically combined signals, respectively.

10. A bootstrapping level control circuit for use in a word line signal producing circuit in a DRAM for detecting an existing potential level at a word line signal source and for providing variable bootstrapping efficiency according to said detected existing potential level at said word line signal source to supply sufficient supply voltage Vcc of said word line signal source to a memory cell array apparatus and to prevent double bootstrapping effects from occurring in a word line signal transferring control circuit, said bootstrapping level control circuit comprises:

a Vcc level detector for detecting said existing potential level at said word line signal source, said Vcc level detector including a first, second and a third Vcc level detecting circuits with each said Vcc level detecting circuit having a predetermined inverting level, respectively, with each said predetermining inverting level of each said Vcc level detecting circuit being different relative to each other, with said first, second and third Vcc level detecting circuits of said Vcc level detector being connected, in parallel, to said word line signal source, respectively, such that, in use, each said Vcc level detecting circuit outputs a detected signal;

a logic combination circuit for logically combining a bootstrapping control signal with each said detected signal detected by each said first, second and third Vcc level detecting circuit of said Vcc level detector, said logic combination circuit including a NAND gate (G5) having two inputs connected to each other with said connected inputs receiving, in use, said bootstrapping control signal, and NAND gates (G6), (G7) and (G8), with one input of each said NAND gate being connected to each other and to said inputs of said NAND gate (G5) to thereby receive, in use, said bootstrapping control signal, and a remaining input of each said NAND gate (G6), (G7) and (G8) connected to each said first, second and third Vcc level detecting circuit, respectively for receiving said detected signals of said Vcc level detecting circuits, respectively, such that, in use, each said NAND gate outputs a logically combined signal;

an inverting circuit having NOT gates (G1), (G2), (G3) and (G4) for delaying, respectively, each said logically combined signal outputted from each said NAND gates (G5), (G6), (G7) and (G8) of said logic combination circuit to invert each said logically combined signal to form an inverted signal for each said logically combined signal received; and, a bootstrapping circuit for bootstrapping a bootstrapping point, node (N1), by receiving each said inverted signal, said bootstrapping circuit including a bootstrapping capacitor Cboost and MOSFET capacitors (C2), (C3) and (C4), with each said capacitor having a source, a drain and a gate electrode and with said source electrode and said drain electrode of each said capacitor being connected to each other and further connected to NOT gate (G1), (G2), (G3) and (G4) of said inverting circuit, respectively, and with said gate electrode of each said capacitor Cboost, (C2), (C3) and (C4), being connected, in parallel, to said bootstrapping point, node (N1), respectively, such that in use said bootstrapping point, node (N1), is bootstrapped depending upon said inverted signals outputted from said respective NOT gates (G1), (G2), (G3) and (G4) of said inverting circuit, thereby varying bootstrapping efficiency of said bootstrapping level control circuit depending upon said potential detected at said word line signal source.

11. The bootstrapping level control circuit of claim 10, wherein each of said first, second and third Vcc level detecting circuits comprises:

a MOSFET (Q3) having a gate electrode and a drain electrode connected to each other and to said word line signal source, and a source electrode;

a MOSFET (Q4) having a gate electrode and a drain electrode connected to each other and to said source electrode of said MOSFET (Q3), and a source electrode connected to a junction (P1);

a MOSFET (Q5) having a gate electrode and a drain electrode connected to each other and to said junction (P1), and a source electrode;

a MOSFET (Q6) having a gate electrode and a drain electrode connected to each other and to said source electrode of said MOSFET (Q5), and a source electrode connected to a junction (P2), with each said gate electrode of each said MOSFET (Q3), (Q4), (Q5) and (Q6) having a predetermined a width Wna, respectively;

a MOSFET (Q7) having a gate electrode connected to said junction (P1), a drain electrode connected to said junction (P2), and a source electrode connected to a ground, with said gate electrode of said MOSFET (Q7) having a predetermined width Wnb such that, in use, said MOSFET (Q7) varies a potential level at said junction (P2) by varying the value of the on-resistance in accordance with a potential level of said junction (P1) according to the ratio of Wna to Wnb; and, a NOT gate (G9) having an input terminal connected to said junction (P2), and an output terminal connected to any one of said remaining inputs of said NAND gates (G6), (G7) and (G8), with said NOT gate (G9) having a predetermined inverting level, thereby alternatively inverting said potential level of said junction (P2) through said NOT gate (G9), either to a "high" level state or to a "low" level state, depending upon said predetermined inverting level of said NOT gate (G9).

12. The bootstrapping level control circuit of claim 11, wherein each said MOSFET (Q3), (Q4), (Q5), (Q6) and (Q7) is a N-channel MOSFET.

* * * * *

UNITED STATES PATENT AND TRADEMARK OFFICE
CERTIFICATE OF CORRECTION

PATENT NO. : 5,073,731
DATED : December 17, 1991
INVENTOR(S) : Jong Hoon Oh It is certified that error appears in the above-identified patent and that said Letters Patent is hereby corrected as shown below:

Column 10, line 8, claim 1; delete "a" after the word "with".

Column 10, line 35, claim 1; insert --of-- after the word "each".

Column 10, line 41, claim 1; insert --of-- after the word "each".

Column 11, line 43, claim 4; delete "a" after the word "with".

Column 11, line 48, claim 4; "circuit" should read as --circuits--.

Column 12, line 36, claim 4; insert --of-- after the word "each".

Column 12, line 42, claim 4; insert --of-- after the word "each".

Column 12, line 53, claim 4; insert --of-- after the word "each".

Column 13, line 4, claim 6; delete "a" after the word "with".

Column 13, line 18, claim 6; insert --of-- after the word "each".

UNITED STATES PATENT AND TRADEMARK OFFICE
CERTIFICATE OF CORRECTION

PATENT NO. : 5,073,731
DATED : December 17, 1991
INVENTOR(S) : Jong Hoon Oh

It is certified that error appears in the above-identified patent and that said Letters Patent is hereby corrected as shown below:

Column 13, line 19, claim 6; "outputted" should read as --output--.

Column 13, line 24, claim 6; insert --of-- after the word "each".

Column 13, line 35, claim 6; insert --of-- after the word "each".

Column 14, line 46, claim 10; delete "a" after the word "including".

Column 15, line 11, claim 10; "outputted" should read as --output--.

Column 15, line 11, claim 10; insert --of-- after the word "each".

Column 15, line 32, claim 10; "outputted" should read as --output--.

UNITED STATES PATENT AND TRADEMARK OFFICE
CERTIFICATE OF CORRECTION

PATENT NO. : 5,073,731
DATED : December 17, 1991
INVENTOR(S) : Jong Hoon Oh

It is certified that error appears in the above-indentified patent and that said Letters Patent is hereby corrected as shown below:

Column 15, line 32, claim 10; "outputted" should read as --output--.

Signed and Sealed this

Twenty-ninth Day of June, 1993

Attest:

MICHAEL K. KIRK

*Attesting Officer*   *Acting Commissioner of Patents and Trademarks*